United States Patent
Assefa et al.

(10) Patent No.: US 7,790,495 B2
(45) Date of Patent: Sep. 7, 2010

(54) OPTOELECTRONIC DEVICE WITH GERMANIUM PHOTODETECTOR

(75) Inventors: Solomon Assefa, Ossining, NY (US); Stephen Walter Bedell, Wappingers Falls, NY (US); Yurii A. Vlasov, Katonah, NY (US); Fengnian Xia, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 305 days.

(21) Appl. No.: 11/925,170

(22) Filed: Oct. 26, 2007

(65) Prior Publication Data
US 2009/0108384 A1 Apr. 30, 2009

(51) Int. Cl.
*H01L 21/00* (2006.01)
(52) U.S. Cl. .............. 438/63; 438/69; 438/93; 438/98; 257/459; 257/453; 257/455; 257/E31.011; 257/E21.158
(58) Field of Classification Search .............. 438/63, 438/69, 93, 98; 257/459, 453, 455, E31.011, 257/E21.158
See application file for complete search history.

(56) References Cited

U.S. PATENT DOCUMENTS

| | | | |
|---|---|---|---|
| 3,898,605 A | 8/1975 | Burns | |
| 5,391,869 A | 2/1995 | Ade et al. | |
| 5,525,828 A | 6/1996 | Bassous et al. | |
| 5,910,012 A | 6/1999 | Takeuchi | |
| 6,310,995 B1 | 10/2001 | Saini et al. | |
| 6,316,281 B1 | 11/2001 | Lee et al. | |
| 6,406,743 B1 | 6/2002 | Lee et al. | |
| 6,795,622 B2 | 9/2004 | Forrest et al. | |
| 6,819,839 B2 | 11/2004 | Zheng et al. | |
| 6,897,498 B2 | 5/2005 | Gothoskar et al. | |
| 7,095,938 B2 | 8/2006 | Tolstikhin | |
| 2004/0087160 A1* | 5/2004 | Agnello et al. | 438/690 |
| 2006/0110844 A1* | 5/2006 | Lee et al. | 438/57 |
| 2007/0104411 A1 | 5/2007 | Ahn et al. | |
| 2007/0189688 A1 | 8/2007 | Dehlinger et al. | |
| 2007/0262296 A1* | 11/2007 | Bauer | 257/19 |
| 2008/0044968 A1* | 2/2008 | Murthy et al. | 438/229 |

OTHER PUBLICATIONS

Y. Liu et al., "High-Quality Single-Crystal Ge On Insulator by Liquid-Phase Epitaxy," Applied Physics Letter, Apr. 2004, pp. 2563-2565, vol. 84, No. 14.
Y. Liu et al., "Rapid Melt Growth of Germanium Crystals with Self-Aligned Microcrucibles on Si Substrates," Journal of the Electrochemical Society, Jul. 2005, pp. G688-G693, vol. 152, No. 8.
G. Masini et al. (Luxtera, Inc), "A four-channel, 10Gbps monolithic optical receiver in 130nm CMOS with integrated Ge waveguide photodetectors," 2007 IEEE International Conference on Group IV Photonics, Sep. 2007, pp. 1-3.

* cited by examiner

*Primary Examiner*—Tu-Tu V Ho
(74) *Attorney, Agent, or Firm*—Vazken Alexanian; Ryan, Mason & Lewis, LLP (57) ABSTRACT

An optoelectronic device comprises a photodetector feature, an interfacial layer disposed above at least a portion of the photodetector feature, and a vertical contact disposed on at least a portion of the interfacial layer. The photodetector feature comprises germanium and is operative to convert a light signal into an electrical signal. The interfacial layer comprises nickel. Finally, the vertical contact is operative to transmit the electrical signal from the photodetector feature.

10 Claims, 10 Drawing Sheets

OPTOELECTRONIC DEVICE WITH GERMANIUM PHOTODETECTOR

FIELD OF THE INVENTION

This invention relates generally to integrated circuits, and, more particularly, to integrated circuits comprising optoelectronic devices.

BACKGROUND OF THE INVENTION

Optical interconnects can offer significant advantages over electrical circuitry in the field of advanced microelectronics. One possible implementation of a deeply-scaled optical interconnect system is based on silicon-on-insulator (SOI) technology, in which optical waveguides are formed on the same thin silicon layer as other complimentary-metal-oxide-semiconductor (CMOS) circuit elements (e.g., field effect transistors (FETs), capacitors, resistors, etc.). Light sources produce optical signals (e.g., light pulses) that propagate in these optical waveguides. Photodetectors convert the optical signals into electrical signals.

A photodetector will typically need to be made from either silicon (Si) or germanium (Ge) in order to be compatible with CMOS processing. An implementation of a Ge photodetector is described in, for example, U.S. Patent Publication No. 2007/0189688 A1, entitled "Waveguide Photodetector," which is commonly assigned herewith and is incorporated by reference herein. Embodiments of this invention describe a horizontal Ge waveguide photodetector that overlies and runs parallel with a horizontal Si waveguide. Light signals propagate in the Si waveguide and are simultaneously coupled into the Ge waveguide photodetector. Electrical contacts to the Ge waveguide photodetector allow the coupled light to be detected.

Nevertheless, the integration of Ge into a conventional CMOS process is complicated by the additional thermal budget required by Ge growth, the maximum temperature Ge can withstand, cross-contamination issues, Ge doping issues, Ge passivation issues, and the tendency of Ge to form non-ohmic contacts when mated with those metallic materials conventionally used for vertical contacts. There is a need, as a result, for structures and process integration schemes that overcome some or all of these issues and allow Ge waveguide photodetectors to be effectively fabricated in a manner that is compatible with conventional CMOS processing.

SUMMARY OF THE INVENTION

Embodiments of the present invention address the above-identified need by providing structures and process integration schemes that allow horizontal Ge waveguide photodetectors to be effectively formed in a manner that is compatible with conventional CMOS processing.

In accordance with an aspect of the invention, an optoelectronic device comprises a photodetector feature, an interfacial layer disposed above at least a portion of the photodetector feature, and a vertical contact disposed on at least a portion of the interfacial layer. The photodetector feature comprises germanium and is operative to convert a light signal into an electrical signal. The interfacial layer comprises nickel. Finally, the vertical contact is operative to transmit the electrical signal from the photodetector feature.

In accordance with one of the above-identified embodiments of the invention, an optoelectronic device comprises a photodetector feature comprising germanium on a waveguide feature comprising silicon. Some of the light transmitted by the waveguide feature is guided into the photodetector feature where it is converted into electrical signals by p-i-n junctions. These electrical signals are transmitted from the photodetector feature by several vertical contacts. The vertical contacts are coupled to the germanium photodetector feature through an interfacial layer comprising nickel and silicon. Advantageously, this interfacial layer allows the vertical contacts to the photodetector feature to display nearly ohmic behavior.

These and other features and advantages of the present invention will become apparent from the following detailed description which is to be read in conjunction with the accompanying drawings.

DETAILED DESCRIPTION OF THE INVENTION

The present invention will be described with reference to illustrative embodiments. For this reason, numerous modifications can be made to these embodiments and the results will still come within the scope of the invention. No limitations with respect to the specific embodiments described herein are intended or should be inferred.

Particularly with respect to processing steps, it is emphasized that the descriptions provided herein are not intended to encompass all of the processing steps which may be required to successfully form a functional device in an integrated circuit. Rather, certain processing steps which are conventionally used in forming integrated circuit devices, such as, for example, wet cleaning and annealing steps, are purposefully not described herein for economy of description. However one skilled in the art will readily recognize those processing steps omitted from this generalized description. Moreover, details of conventional semiconductor processing steps described herein will only be described generally since the details of these conventional processes will be known to one skilled in the art and since there are commercially available semiconductor processing tools for implementing these processing steps. Details of the processing steps used to fabricate semiconductor devices may be found in a number of publications, for example, S. Wolf and R. N. Tauber, *Silicon Processing for the VLSI Era, Volume* 1, Lattice Press, 1986; and S. Wolf, *Silicon Processing for the VLSI Era, Volume* 4: *Deep Submicron Process Technology*, Lattice Press, 2002, both of which are incorporated herein by reference.

It should also be understood that the various layers and/or regions shown in the accompanying figures are not drawn to scale, and that one or more semiconductor layers and/or regions of a type commonly used in such integrated circuits may not be explicitly shown in a given figure for ease of explanation. This does not imply that the semiconductor layers and/or regions not explicitly shown are omitted from the actual integrated circuit. Also, where identical features are found in the different illustrative embodiments, identical reference numerals will be utilized.

Figure 1A:
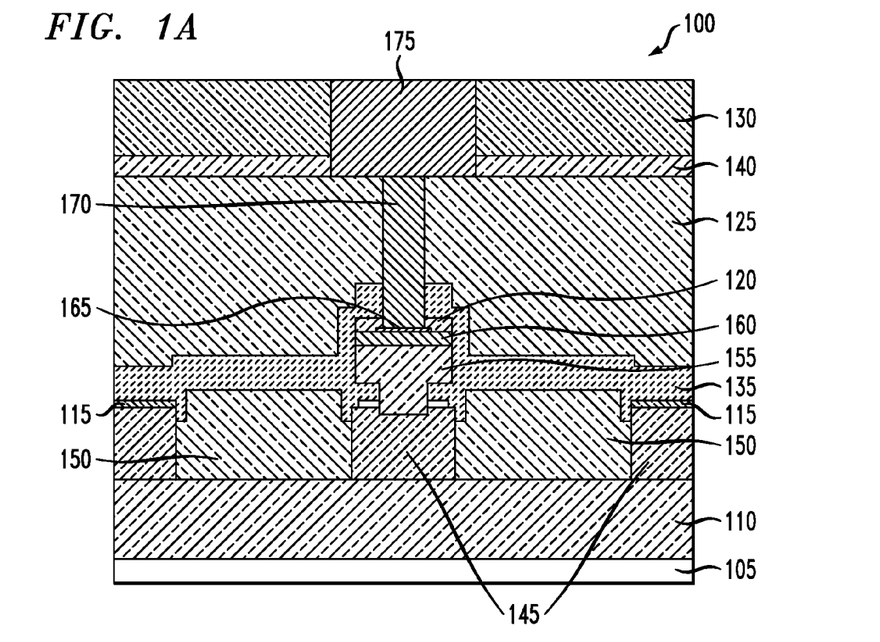
FIGS. 1A and 1B show a sectional view and a plan view, respectively, of a first optoelectronic device in accordance with a first illustrative embodiment of the invention.
Figure 1B:
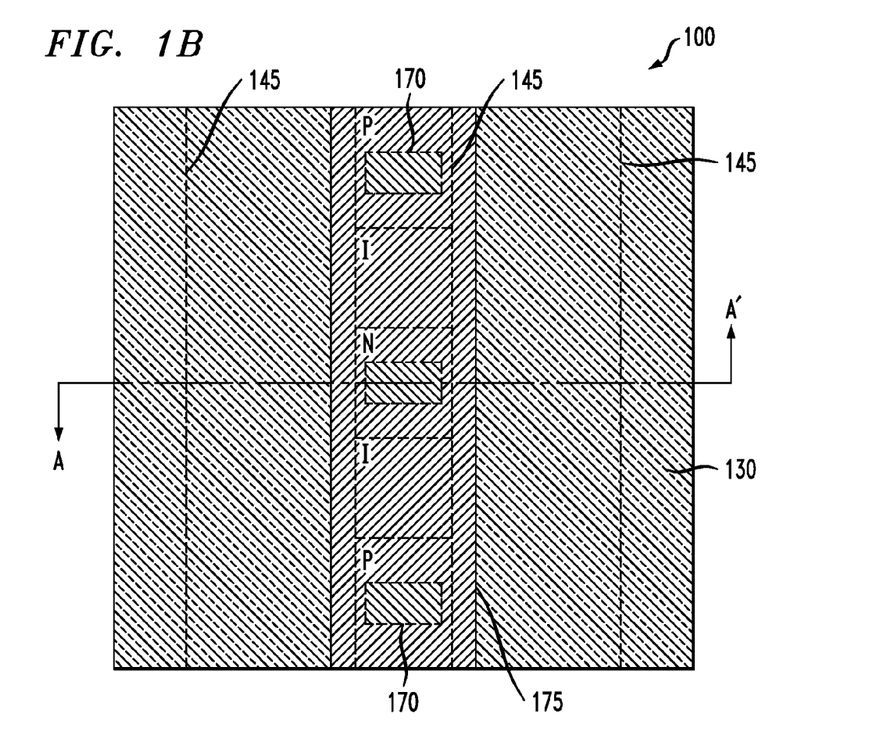

FIGS. 1A and 1B show a sectional view and a plan view, respectively, of a first optoelectronic device 100 in accordance with a first illustrative embodiment of the invention. The optoelectronic device is built onto a substrate 105. It includes a lower oxide layer 110, waveguide oxide layers 115, a photodetector oxide layer 120, a middle oxide layer 125, and an upper oxide layer 130. It further includes a lower nitride layer 135 and an upper nitride layer 140. Waveguide features 145 lie on the lower oxide layer, and oxide isolation features 150 fill in the regions between waveguide features. A photodetector feature 155 is disposed on the center waveguide feature and is capped by a photodetector capping layer 160 and an interfacial layer 165. Vertical contacts 170 land on the interfacial layer and are coupled to a metallization line 175.

In the particular illustrative optoelectronic device 100, the substrate 105 and the waveguide feature 145 comprise crystalline Si. Moreover, those elements labeled with the term "oxide" comprise silicon oxide ($SiO_x$) (hereinafter called "SiO"), while those elements labeled with the term "nitride" comprise silicon nitride ($Si_xN_y$) (hereinafter called "SiN"). The photodetector feature 155 comprises crystalline Ge, while the photodetector capping layer 160 comprises doped (i.e., conductive) Si and the interfacial layer 165 comprises an alloy of nickel (Ni) and Si (hereinafter called "Ni—Si"). Finally, the vertical contacts 170 comprise tungsten (W) and also possibly a very thin liner comprising titanium (Ti) and titanium nitride (TiN), while the metallization line 175 comprises copper (Cu). Nevertheless, it should be noted that several of these material choices are merely illustrative and that substitute materials may be used in several instances with the resultant optoelectronic device still coming within the scope of the invention. Rather than comprising crystalline Ge, the photodetector feature could, as just one example, be formed of other Ge-containing materials such as, but not limited to, $Si_xGe_{1-x}$ or $Si_xGe_yC_{1-x-y}$. Moreover, the Ge photodetector feature may be amorphous or polycrystalline rather than crystalline.

As indicated in the plan view in FIG. 1B, the photodetector feature 155 is contacted by several vertical contacts 170. These vertical contacts allow the photodetector feature to be differentially doped such that several p-i-n junctions (where "i" represents an intrinsic layer) are formed along its length. Alternatively, p-n junctions may be formed. The p-regions may, for example, comprise Ge doped with boron (B), while the n-regions may comprise Ge doped with phosphorous (P).

The illustrative optoelectronic device 100 is designed to operate as a waveguide photodetector. As a substitute for the transmission of electrical signals in metallization lines, light signals (e.g., light pulses) are guided by the waveguide features 145, which are shaped as strips. These strips may, for example, have widths in the range of approximately 200 nanometers (nm) to approximately 600 nm, and thicknesses in the range of approximately 150 nm to approximately 350 nm. If the waveguides are formed of Si, these dimensions allow the waveguide features to transmit single modes of light for wavelengths in the range of approximately 1.3 microns (μm) to approximately 1.55 μm. As the light pulses propagate in the center waveguide feature, they are resonantly coupled or guided into the overlying Ge photodetector feature 155, which also acts to propagate the light pulses to some extent. In the photodetector feature, the light pulses are converted into electrical signals by the creation of photocarriers in the photodetector feature's p-n junctions. These electrical signals, in turn, are transmitted away from the photodetector feature by the vertical contacts 170.

Figure 2:
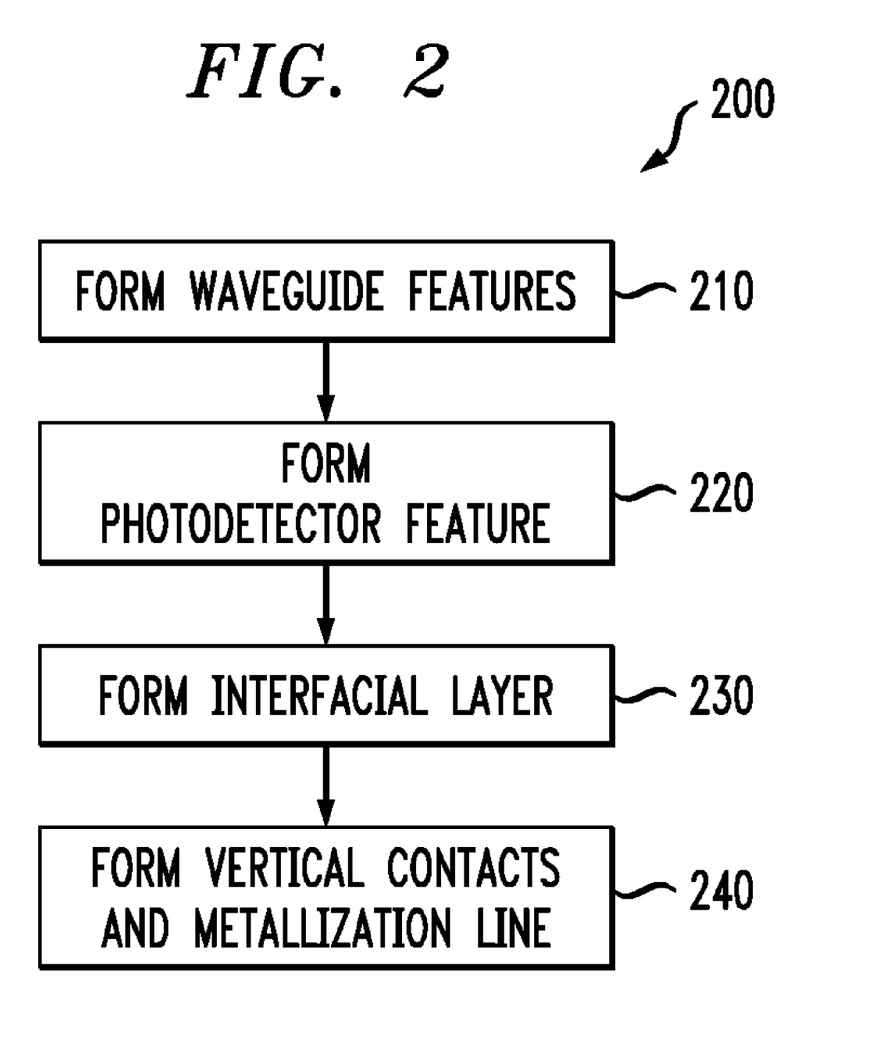
FIG. 2 shows an illustrative method of forming the first optoelectronic device.
Figure 3A:
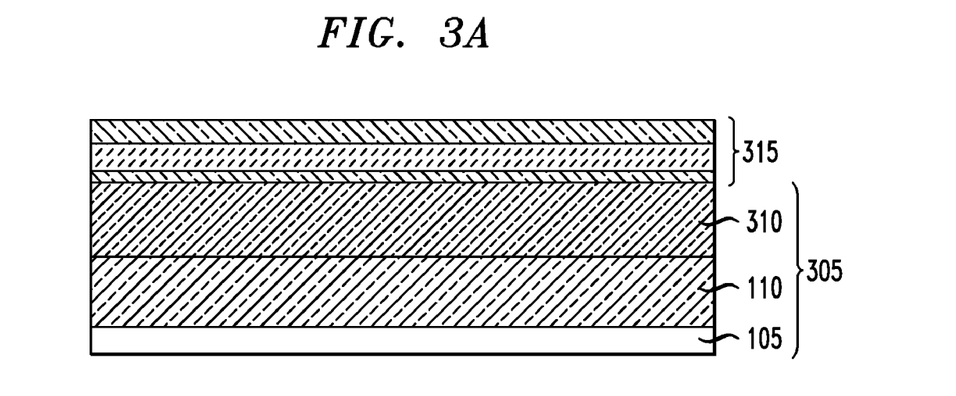
FIGS. 3A-3O show sectional views of the first optoelectronic device in various stages in its formation.
Figure 3B:
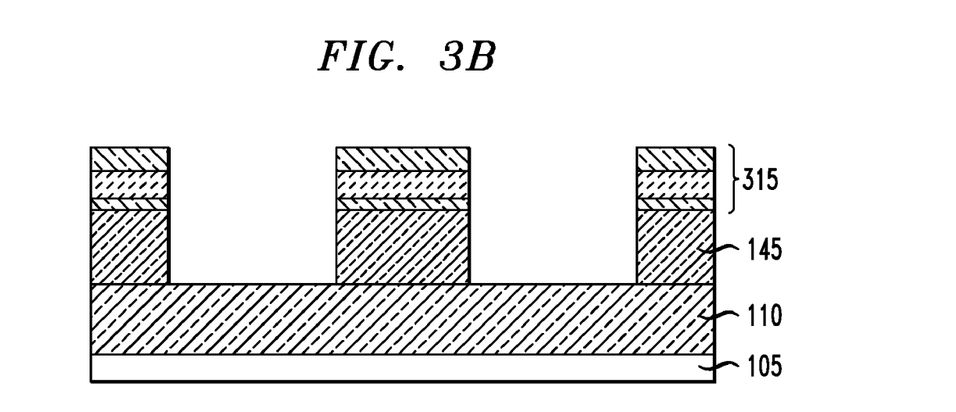
Figure 3C:
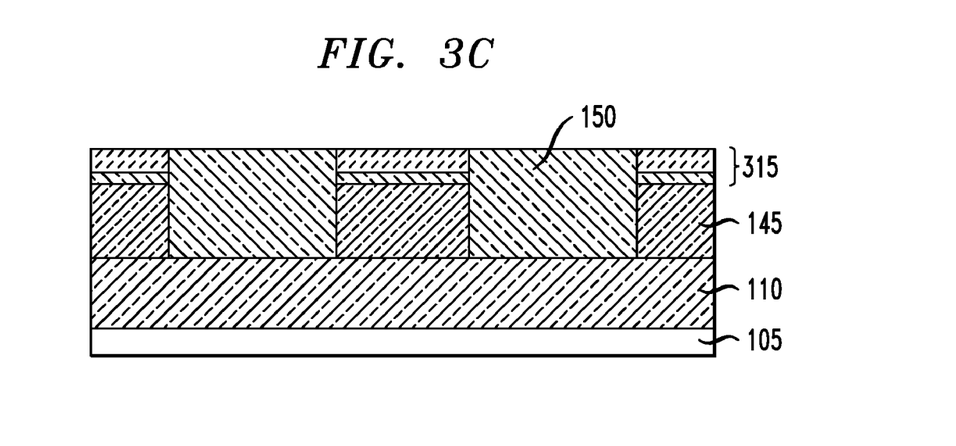

FIG. 2 shows a flow chart of an illustrative method 200 for forming the optoelectronic device 100. FIGS. 3A-3O, moreover, show sectional views of the optoelectronic device in various stages of its formation when using the FIG. 2 method.

Step 210 in the method 200 comprises forming the waveguide features 145. The optoelectronic device 100 is preferably formed on an SOI substrate 305 comprising the substrate 105, the lower oxide layer 110, and a layer of Si 310 that will eventually be patterned into the waveguide features 145. A first hard mask 315 comprising a layer of SiN formed between two layers of SiO is deposited on the SOI substrate as shown in FIG. 3A. Conventional photolithography and reactive ion etching (RIE) are then used to pattern the first hard mask such that the hard mask only remains over those portions of the SOI substrate where waveguide features are intended. RIE is then applied to the layer of Si with the hard mask in place in order to define the waveguide features, as shown in FIG. 3B.

The waveguide features 145 are then exposed to a thermal oxidation process in order to form a thin oxide on their sidewalls. Subsequently, a thick layer of SiO is conformally deposited on the film stack in order to fill in the regions between the waveguide features. Conventional chemical mechanical polishing (CMP) is then used to planarize the conformal SiO, forming the oxide isolation features 150. During this CMP step, a portion of the hard mask is also polished away, as shown in FIG. 3C. The remainder of the hard mask is then removed by conventional wet chemical etches, as shown in FIG. 3D.

Figure 3D:
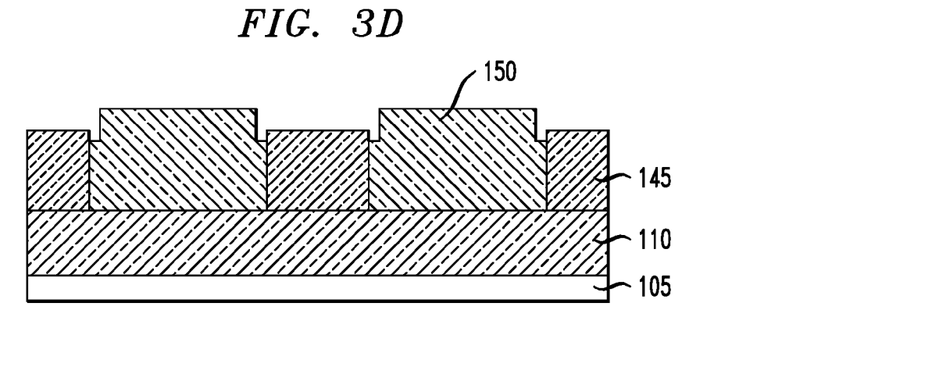
Figure 3E:
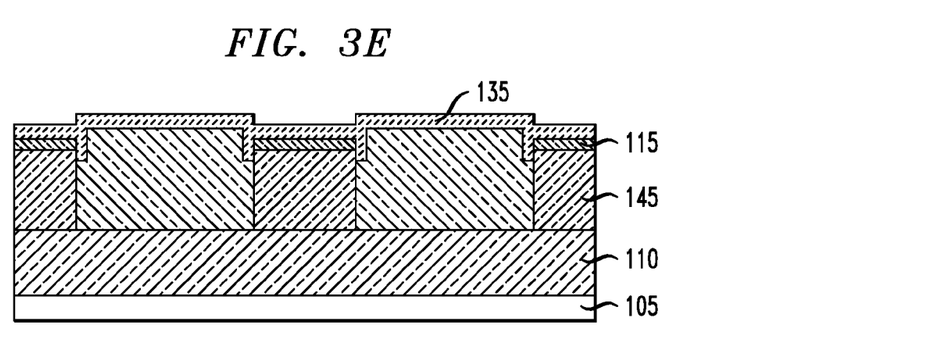

The film stack in FIG. 3D is then exposed to a thermal oxidation process in order to form the waveguide oxide layers 115. This thermal oxidation process may be performed at the same time, for example, as forming the gate oxide for FETs in the remainder of the integrated circuit. Conformal SiN is then conformally deposited on the film stack to form the lower portion of the lower nitride layer 135, as shown in FIG. 3E.

Figure 3F:
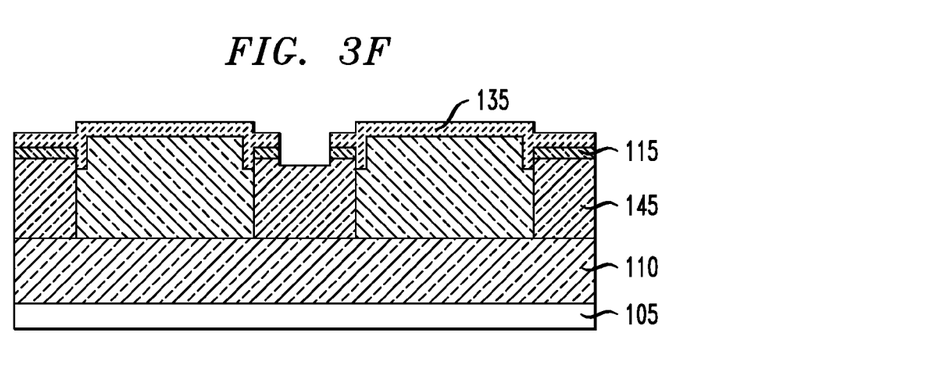
Figure 3G:
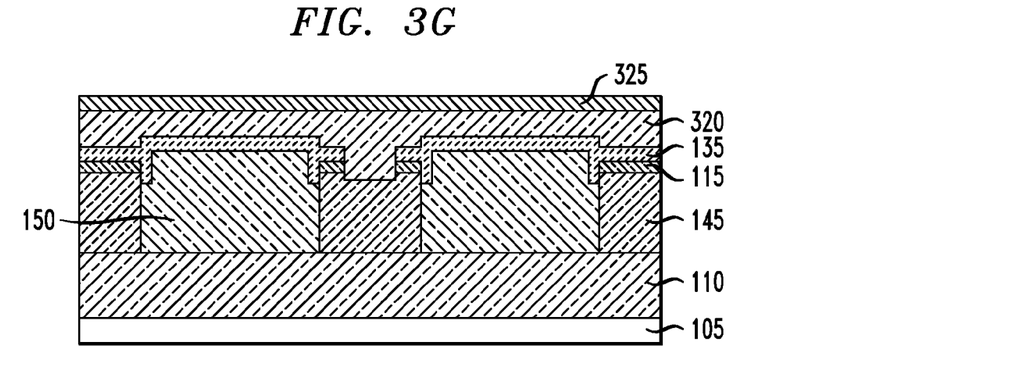

Step 220 in the method 200 comprises forming the photodetector feature 155. To accomplish this step, a hole is formed in the lower portion of the lower nitride layer 135 and in the waveguide oxide layer 115 overlying the center waveguide feature 145 using conventional photolithography and RIE, as shown in FIG. 3F. A layer of Ge 320 that will eventually form the photodetector feature 155 is then deposited onto the film stack, preferably by epitaxial growth, although several other deposition techniques may be used such as chemical vapor deposition (CVD) and physical vapor deposition (PVD). Furthermore, a nucleating or seed layer comprising a thin layer (e.g., about 5-10 nm) of Si, Ge, or an alloy thereof may be deposited before depositing this layer of Ge. Subsequently, a layer of Si 325 that will form the photodetector capping layer 160 is deposited on the Ge. The resultant film stack is shown in FIG. 3G.

Figure 3H:
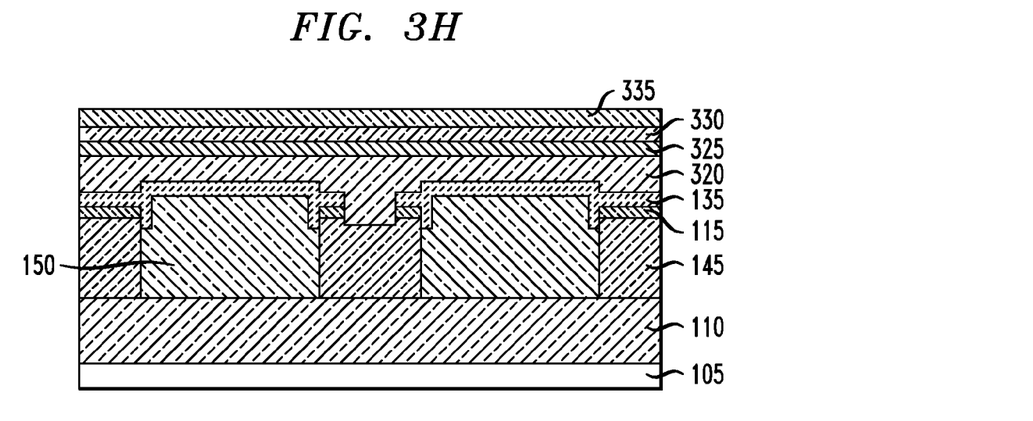
Figure 3I:
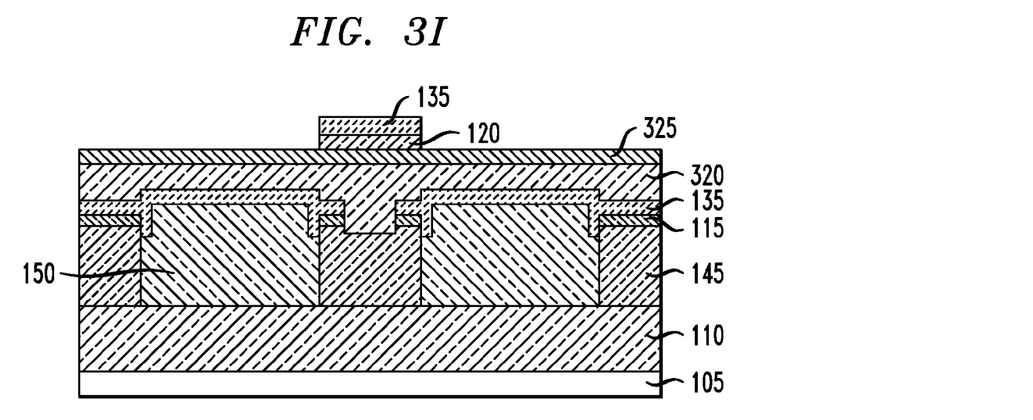
Figure 3J:
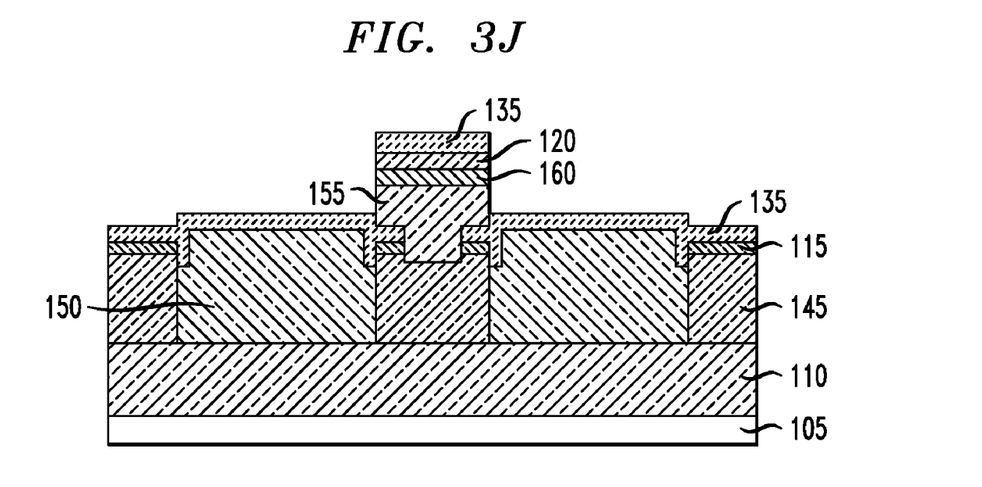
Figure 3K:
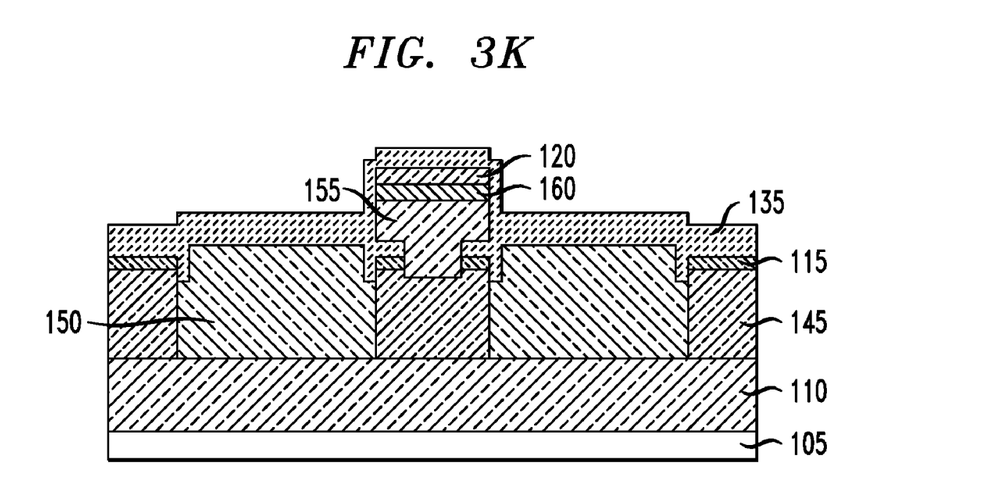

Patterning of the photodetector feature 155 is accomplished by sequentially depositing a layer of SiO 330 on the film stack followed by a layer of SiN 335, as shown in FIG. 3H. Because the layer of Ge 320 may contain impurities when deposited, this is also a good point in the process to anneal the film stack at an elevated temperature (e.g., about 600 C) in order to drive out some of these impurities. The SiN and SiO layers 335, 330 are then patterned by photolithography and RIE to form an island over the region where the photodetector feature is desired, as shown in FIG. 3I. The photodetector oxide layer 120 and another part of the lower nitride layer 135 are thereby formed. These features are then used as a second hard mask to pattern the photodetector features, as shown in FIG. 3J. The photodetector feature is then exposed to a nitrogen-containing ambient (e.g., nitrogen ($N_2$) or ammonia ($NH_3$)) at an elevated temperature (e.g., about 400-600 C), which may act to passivate its sidewalls. Subsequently, a layer of SiN is deposited on the film stack to encapsulate the sidewalls of the photodetector feature in SiN, as shown in FIG. 3K. This SiN deposition completes the formation of the lower nitride layer.

Figure 3L:
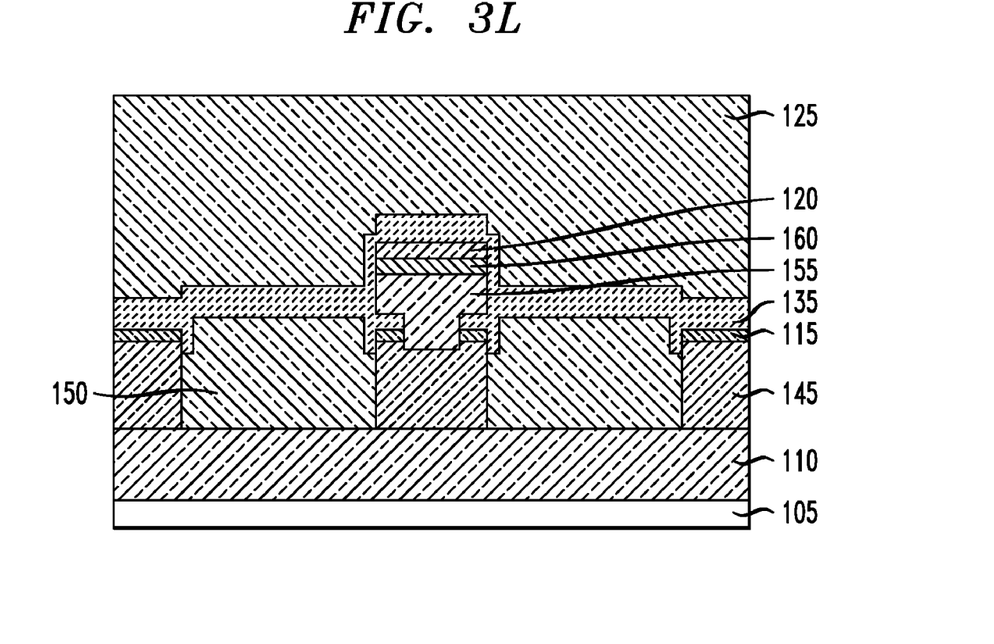
Figure 3M:
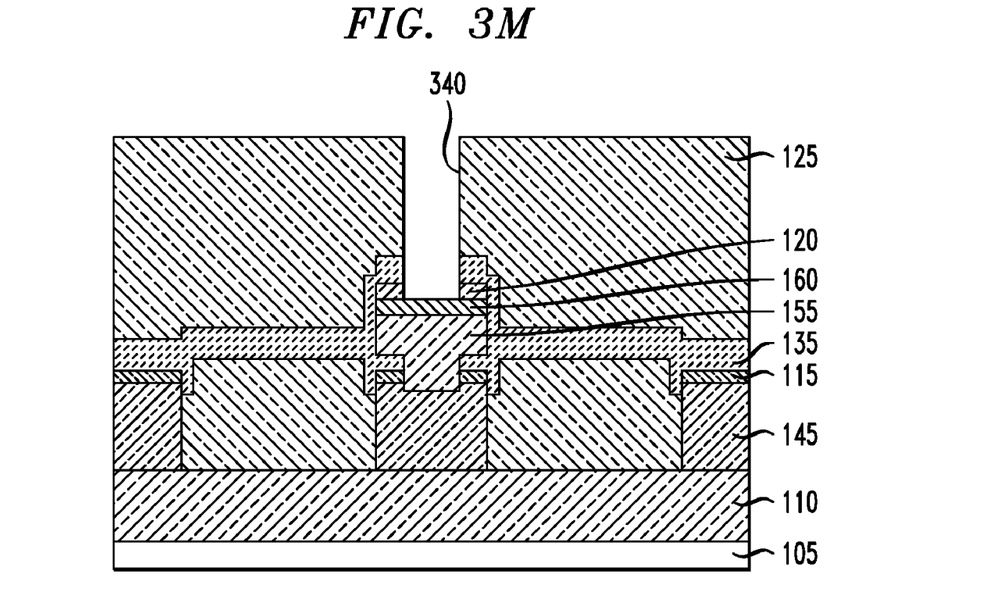
Figure 3N:
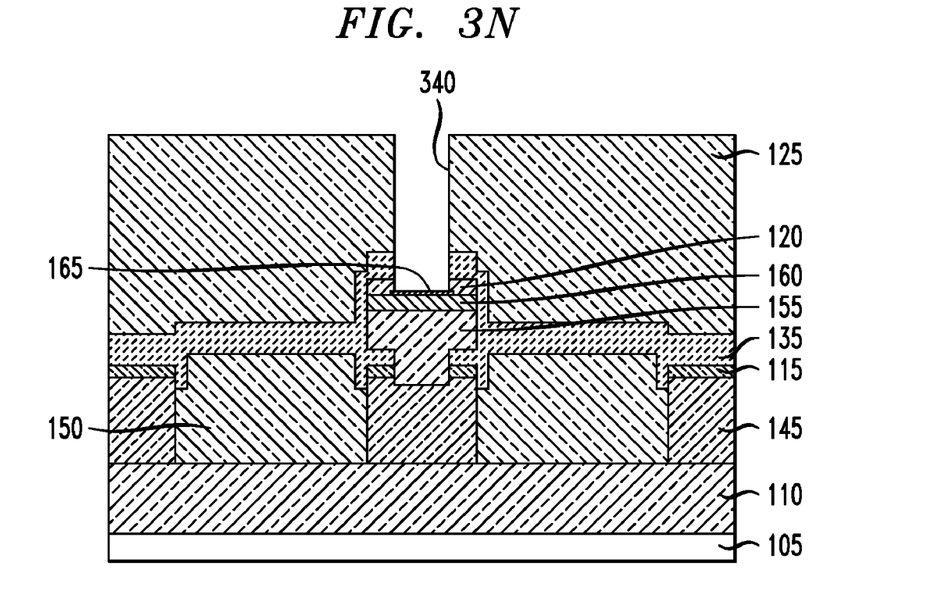
Figure 3O:
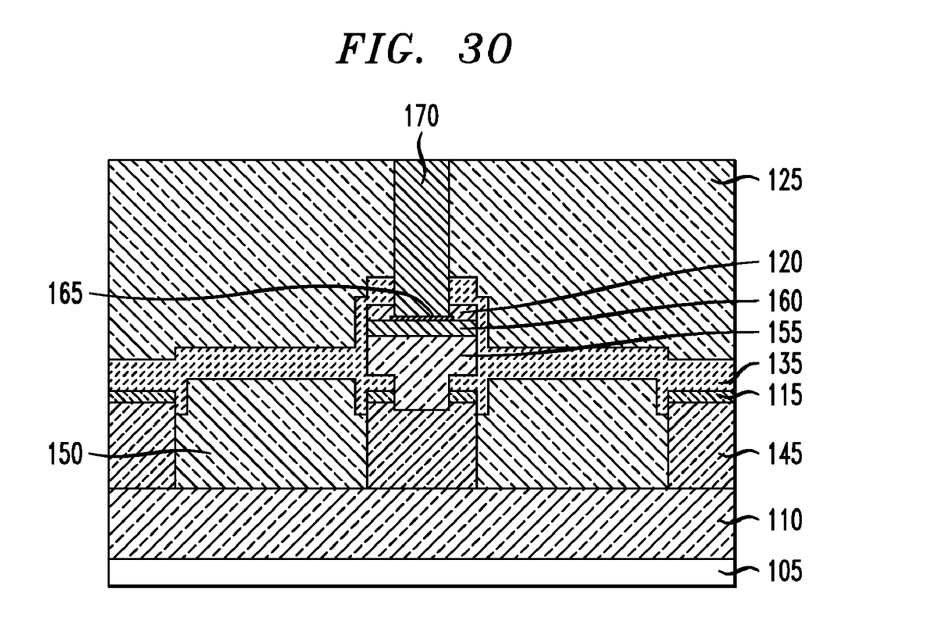

Step 230 in the method 200 comprises forming the interfacial layer 165. After forming the lower nitride layer 135, a thick oxide layer is deposited on the film stack and planarized using CMP, as shown in FIG. 3L. These processing steps form the middle oxide layer 125. It may also be beneficial at this point to quickly anneal (e.g., for about 1-5 seconds) the photodetector feature at high temperature (e.g., about 950 C) in order to further crystallize the Ge. Next, conventional photolithography and RIE are utilized to pattern vias 340 in the middle oxide layer, the lower nitride layer 135, and the photodetector oxide layer 120 such that the vias land on the photodetector capping layer 160, as shown in FIG. 3M. During the etching of the vias, the photodetector oxide layer acts as a convenient etch stop, allowing some over etch without damaging the film stack. With a portion of the photodetector capping layer exposed in this manner, it is then possible to form the interfacial layer at the bottom of the vias, as shown in FIG. 3N.

As indicated earlier, the interfacial layer 165 comprises Ni—Si. Ni—Si is advantageous because it allows the Ge photodetector feature 155 to form a nearly ohmic contact with the W of the vertical contacts 170. The Ni—Si interfacial layer may be formed by depositing Ni and then annealing the film stack at, for example, about 350-450 C for about one minute. It may be advantageous to clean the Si photodetector capping layer 160 before depositing the Ni by exposing the film stack to a wet chemical etch comprising dilute hydrofluoric acid Any unreacted Ni can be subsequently removed by a solution comprising hydrochloric acid.

With the vias 340 formed over the photodetector feature, it is also possible to form the p-n junctions in the photodetector feature 155 by implanting dopants into the photodetector feature through the vias. Some of the vias may be masked using photolithography while others are allowed to remain unmasked. The film stack is then exposed to a first ion implantation step so that a first type of dopant (e.g. P) enters the photodetector feature through the unmasked vias. Subsequently, another photolithographic mask is utilized to expose a second set of vias, and a second type of dopant (e.g., B) is implanted into the photodetector through these unmasked vias.

When doping the Ge photodetector feature with P to form an n-doped region, it may be advantageous to perform several cycles to obtain the final doping, each cycle comprising an ion implantation step and an annealing step. The annealing steps may occur at, for example, about 300-400 C.

Step 240 in the method 200 comprises forming the vertical contacts 170 and metallization line 175. Advantageously, these processing steps may be performed at the same time as forming these types of contacts and lines in other portions of the CMOS circuitry. With the interfacial layer 165 in place, W (and possibly Ti/TiN) is conformally deposited into the via 340. Any W deposited on top of the middle oxide layer is then removed by CMP, as shown in FIG. 3O. The upper nitride layer 140 and the upper oxide layer 120 are then deposited on the film stack. A second via in the shape of the metallization line is patterned in these layers by photolithography and RIE. Once formed, the second via is filled with Cu and any excess Cu is removed from the top of the upper oxide layer by another CMP step. The result is the optoelectronic device 100 shown in FIGS. 1A and 1B.

Figure 4A:
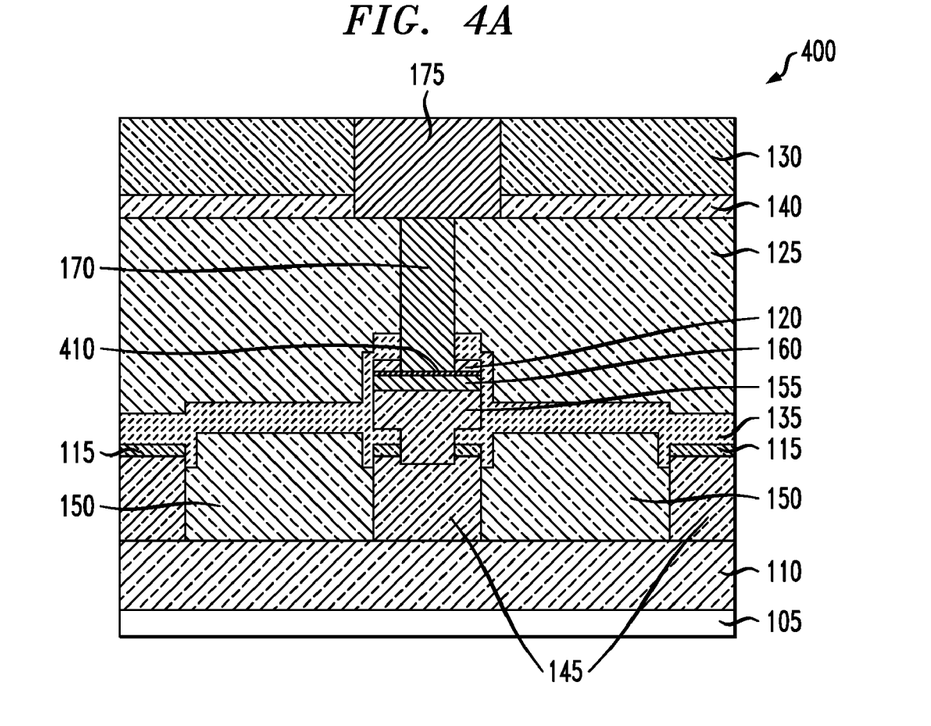
FIG. 4A shows a sectional view of a second optoelectronic device in accordance with a second illustrative embodiment of the invention.
Figure 4B:
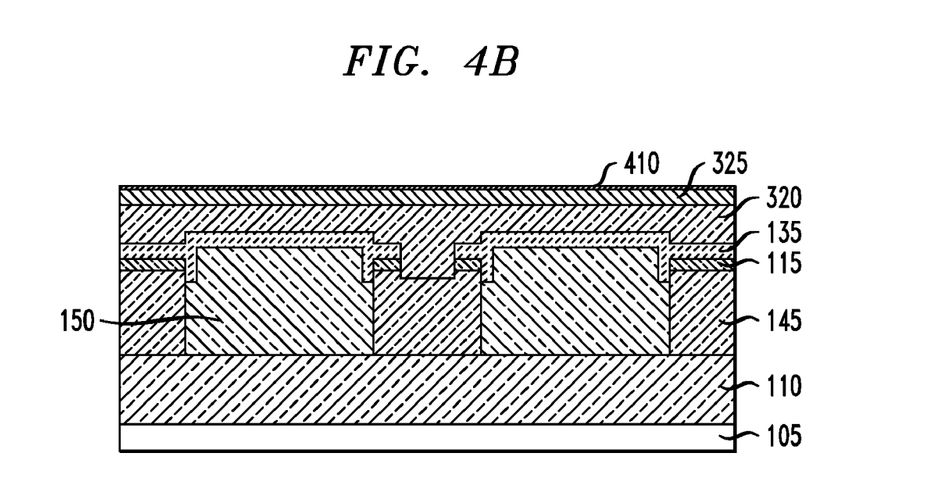
FIG. 4B shows a sectional view of the second optoelectronic device after forming the interfacial layer.

FIG. 4A shows a second optoelectronic device 400 in accordance with a second illustrative embodiment of the invention. This second optoelectronic device is a modified version of the first optoelectronic device 100 shown in FIGS. 1A and 1B. Nevertheless, in the second optoelectronic device, an interfacial layer 410 occupies the entire top of the photodetector capping layer 160 rather than being located only at the bottoms of the vertical contacts 170. The second optoelectronic may be formed in a manner similar to that described above for the first optoelectronic device. For the second version, the interfacial layer 410 is formed after deposing the layer of Si 325 that will become the photodetector capping layer 160 and before depositing the SiN and SiO layers 330, 335, as shown in FIG. 4B. Later in the process, the vias 340 that are formed for the vertical contacts 170 are allowed to land on this already-formed interfacial layer. In this way, each of the vertical contacts makes contact to the photodetector feature 155 through the interfacial layer, thereby achieving the attendant advantages discussed above.

Figure 5:
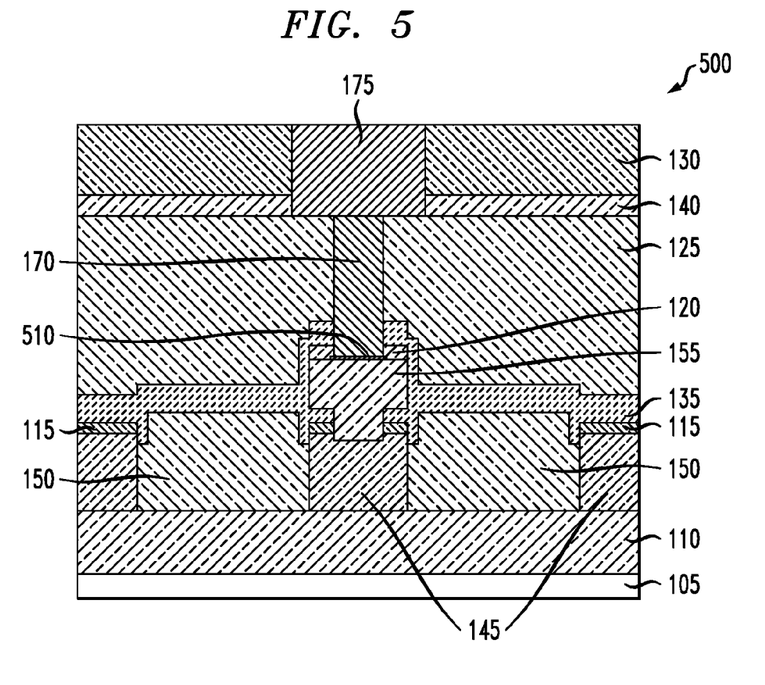
FIG. 5 shows a sectional view of a third optoelectronic device in accordance with a third illustrative embodiment of the invention.
Figure 6:
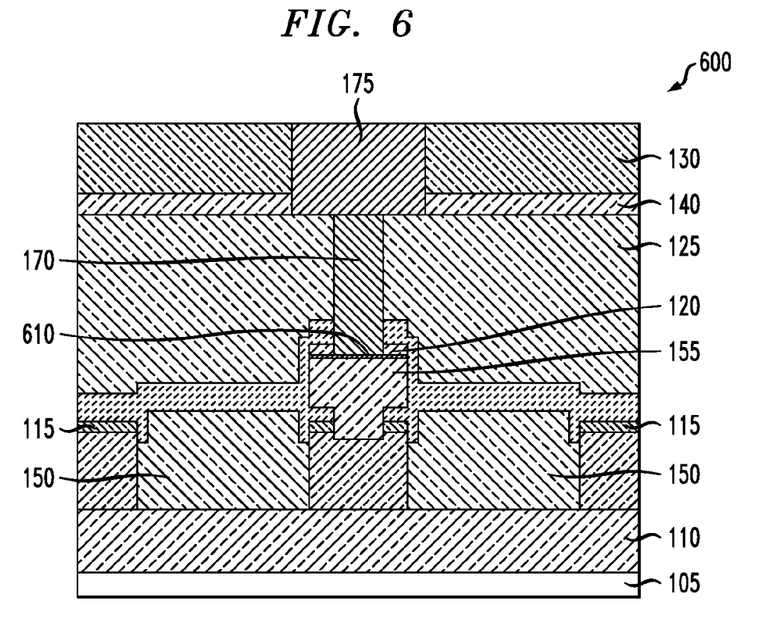
FIG. 6 shows a sectional view of a fourth optoelectronic device in accordance with a fourth illustrative embodiment of the invention.

FIGS. 5 and 6 show sectional views of a third optoelectronic device 500 and fourth optoelectronic device 600, respectively, in accordance with third and fourth illustrative embodiments of the invention. In contrast to the previously described optoelectronic devices 100, 400, however, these embodiments utilize an alloy of Ni and Ge (herein after called "Ni—Ge") to form interfacial layers for the vertical contacts 170 rather than Ni—Si. Ni—Ge has many of the same advantageous properties of Ni—Si. It allows, for example, vertical contacts comprising W to display nearly ohmic behavior when mated to Ge photodetector features 155.

The third optoelectronic device 500 in FIG. 5 is formed in a manner similar to the first optoelectronic device 100 shown in FIGS. 1A and 1B, except that, when forming the third device, no Si photodetector capping layer 160 is formed on the photodetector feature 155. Rather, the SiN and SiO layers 330, 335 are allowed to deposit directly on the photodetector feature. In subsequent processing, a Ni—Ge interfacial layer 510 is formed at the bottom of the vias 340 used for the vertical contacts 170. Ni—Ge can be formed directly on the Ge photodetector feature at the bottom of the vias in a manner similar to forming Ni—Si on the photodetector capping layer.

The fourth optoelectronic device 600, in contrast, is formed in a manner similar to the forming of the second optoelectronic device 400 shown in FIG. 4A. Here, a Ni—Ge interfacial layer 610 occupies the entire upper surface of the photodetector feature 155. For this embodiment, the interfacial layer is formed after depositing the layer of Ge 320 that will become the photodetector feature and before depositing the SiN and SiO layers 330,335. The vias 340 for the vertical contacts land 170 are then allowed to land on this already-formed Ni—Ge interfacial layer later in the fabrication process.

Methods in accordance with aspects of the invention may be utilized to form an integrated circuit. The integrated circuit design is created in a graphical computer programming language, and is stored in a computer storage medium (such as a disk, tape, physical hard drive, or virtual hard drive such as in a storage access network). If the designer does not fabricate integrated circuits or photolithographic masks used to fabricate integrated circuits, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the integrated circuit design in question that are formed on a wafer. The photolithographic masks are utilized to define areas of the wafer (and/or the layers thereon) to be etched or otherwise processed.

The resulting integrated circuits may be distributed by the fabricator in raw wafer form (i.e., as a single wafer that has multiple unpackaged integrated circuits), as a bare die, or in packaged form. In the latter case, the integrated circuit is mounted in a single integrated circuit package (e.g., plastic carrier with leads that are affixed to a motherboard or other higher level carrier) or in a multi-integrated circuit package (e.g., ceramic carrier that has either or both surface interconnections or buried interconnections). In any case, the integrated circuit is then integrated with other chips, discrete circuit elements, and/or other signal processing devices as part of either an intermediate product (e.g., motherboard) or an end product. The end product may be any product that includes integrated circuits, ranging from toys and other low-end applications to advanced computer products having a display, a keyboard or other input device, and a central processor.

Although illustrative embodiments of the present invention have been described herein with reference to the accompanying figures, it is to be understood that the invention is not limited to those precise embodiments, and that various other changes and modifications may be made to these embodiments by one skilled in the art without departing from the scope of the appended claims.

What is claimed is:

1. A method of forming an optoelectronic device, the method comprising the steps of:

forming a photodetector feature, the photodetector feature comprising germanium and operative to convert a light signal into an electrical signal;

forming an interfacial layer above at least a portion of the photodetector feature, wherein the interfacial layer is formed by depositing nickel above the photodetector feature and applying an annealing process such that the interfacial layer comprises an alloy of nickel and an element of a layer directly therebelow;

forming a vertical contact on at least a portion of the interfacial layer, the vertical contact operative to transmit the electrical signal from the photodetector feature; and forming a capping layer at least partially between the photodetector feature and the interfacial layer.

2. The method of claim 1, further comprising the step of forming a waveguide feature adjacent to the photodetector feature, the waveguide feature operative to guide the light signal in the optoelectronic device.

3. The method of claim 2, wherein the waveguide feature comprises silicon.

4. The method of claim 1, wherein the capping layer comprises silicon.

5. The method of claim 1, further comprising the step of forming a via in one or more dielectric layers that overlie the photodetector feature, and wherein the step of forming the vertical contact comprises forming a metallic feature in the via.

6. The method of claim 5, wherein the via is formed before the step of forming the interfacial layer.

7. The method of claim 6, wherein the interfacial layer is formed at the bottom of the via.

8. The method of claim 5, wherein the via is formed after the step of forming the interfacial layer.

9. The method of claim 1, wherein the alloy comprises an alloy of nickel and silicon.

10. The method of claim 1, wherein the alloy comprises an alloy of nickel and germanium.

* * * * *